(12) United States Patent
Yao

(10) Patent No.: US 9,461,107 B2
(45) Date of Patent: Oct. 4, 2016

(54) EXCIMER LASER ANNEALING APPARATUS AND METHOD OF USING THE SAME

(71) Applicant: Shenzhen China Star Optoelectronics Technology Co., Ltd., Guangdong (CN)

(72) Inventor: Jiangbo Yao, Guangdong (CN)

(73) Assignee: Shenzhen China Star Optoelectronics Technology Co., Ltd., Shenzhen (CN)

(*) Notice: Subject to any disclaimer, the term of this patent is extended or adjusted under 35 U.S.C. 154(b) by 0 days.

(21) Appl. No.: 14/406,280

(22) PCT Filed: Oct. 16, 2014

(86) PCT No.: PCT/CN2014/088697
§ 371 (c)(1),
(2) Date: Aug. 25, 2015

(87) PCT Pub. No.: WO2016/058151
PCT Pub. Date: Apr. 21, 2016

(65) Prior Publication Data
US 2016/0104617 A1    Apr. 14, 2016

(30) Foreign Application Priority Data
Oct. 14, 2014  (CN) .......................... 2014 1 0541338

(51) Int. Cl.
| H01L 21/00 | (2006.01) |
| H01L 29/04 | (2006.01) |
| H01S 3/225 | (2006.01) |
| H01S 3/041 | (2006.01) |
| H01L 29/66 | (2006.01) |
| H01L 29/16 | (2006.01) |
| B23K 26/00 | (2014.01) |
| H01L 21/02 | (2006.01) |

(52) U.S. Cl.
CPC ............... *H01L 29/04* (2013.01); *B23K 26/00* (2013.01); *H01L 21/02532* (2013.01); *H01L 21/02686* (2013.01); *H01L 29/16* (2013.01); *H01L 29/6675* (2013.01); *H01S 3/041* (2013.01); *H01S 3/225* (2013.01)

(58) Field of Classification Search
CPC .................. H01L 21/02675; H01L 21/67115; H01L 21/02532; H01L 21/02686; H01L 29/04; H01L 29/16; H01L 29/6675; H01S 3/225; H01S 3/041
See application file for complete search history.

(56) References Cited

U.S. PATENT DOCUMENTS

| 4,735,822 | A * | 4/1988 | Ohtoshi | ................ | C23C 16/452 136/258 |
| 2010/0078424 | A1* | 4/2010 | Tsukamoto | ......... | C23C 16/4586 219/444.1 |

* cited by examiner

*Primary Examiner* — Richard Booth

(57) ABSTRACT

An excimer laser annealing apparatus and the method thereof are disclosed. The apparatus has a substrate holder and an excimer laser unit. The substrate holder has a support surface for supporting a substrate having an amorphous silicon film and a thermoregulating module. The thermoregulating module is used to regulate the temperature on the support surface so as to control crystal orientation of amorphous silicon in the amorphous silicon film. With the thermoregulating module being added, the excimer laser annealing apparatus can control the orientation of recrystallizing of the amorphous silicon.

14 Claims, 2 Drawing Sheets

EXCIMER LASER ANNEALING APPARATUS AND METHOD OF USING THE SAME

RELATED APPLICATIONS

This application is a National Phase of PCT Patent Application No. PCT/CN2014/088697 having International filing date of Oct. 16, 2014, which claims the benefit of priority of Chinese Patent Application No. 201410541338.8 filed on Oct. 14, 2014. The contents of the above applications are all incorporated by reference as if fully set forth herein in their entirety.

BACKGROUND OF THE INVENTION

1. Field of the Invention

The present invention relates to the field of liquid crystal display technology, and more particularly to an excimer laser annealing apparatus and the method of using the same.

2. Description of the Related Art

With amorphous silicon components being wildly used, methods of forming amorphous silicon have become the main research direction. Generally, excimer laser annealing is a critical step to form amorphous silicon. In a traditional excimer laser annealing process, the amorphous silicon firstly turns into a complete melting status by high temperature, and then recrystallizes into polysilicon. Since excimer laser beams in the traditional process are irradiated uniformly on an amorphous silicon film, each portions of the amorphous silicon film substantially has the same temperature, and the starting point of recrystallizing and its direction cannot be controlled. Therefore, after recrystallizing, the crystalline grain size of polysilicon is too small and there are too many grain boundaries between the crystalline grains of the polysilicon, which seriously affecting the electron mobility of the polysilicon, and thus affecting the display effect of a display apparatus.

Therefore, it is necessary to provide an excimer laser annealing apparatus and the method of using the same to overcome the problems existing in the conventional technology.

SUMMARY OF THE INVENTION

An object of the present invention is to provide an excimer laser annealing apparatus and the method of using the same to solve the technical problem where the crystalline grain size of conventional amorphous silicon after crystallizing is too small and there are too many grain boundaries between crystalline grains.

In order to solve the foregoing technical problem, the present invention provides a method of using an excimer laser annealing apparatus to perform annealing, wherein the excimer laser annealing apparatus includes a substrate holder and an excimer laser unit, wherein the substrate holder has a support surface for supporting a substrate having an amorphous silicon film and a thermoregulating module for regulating the temperature on the support surface so as to control crystal orientation of amorphous silicon in the amorphous silicon film, wherein the thermoregulating module is constituted by at least two light-absorbing components and at least two light-reflecting components mounted on the support surface, wherein the light-absorbing components and the light-reflecting components are embedded in the substrate holder; and the excimer laser unit is used to irradiate excimer laser beams onto the substrate; wherein the method of using an excimer laser annealing apparatus to perform annealing comprises steps of:

providing the substrate having an amorphous silicon film on the substrate holder; and using the excimer laser unit to perform an annealing treatment on the amorphous silicon film so that the amorphous silicon of the amorphous silicon film recrystallizes along a thermoregulating direction of the thermoregulating module in a predetermined area to form a polysilicon film, wherein the predetermined area is an area of the amorphous silicon film which corresponds to the position of the thermoregulating module.

In one embodiment of the method of using an excimer laser annealing apparatus to perform annealing of the present invention, during the process of performing the annealing treatment on the amorphous silicon film, the method further comprises a step of forming a temperature gradient between a first portion and a second portion of the amorphous silicon film, wherein the first portion is an area of the amorphous silicon film corresponding to the position of the light-reflecting components of the substrate holder; and the second portion is an area of the amorphous silicon film corresponding to the position of the light-absorbing components of the substrate holder.

In one embodiment of the method of using an excimer laser annealing apparatus to perform annealing of the present invention, in the step of forming the temperature gradient, the first portion of the amorphous silicon film absorbs the energy of the irradiated excimer laser beams and the energy of the excimer laser beams reflected by the light-reflecting components, and the second portion of the amorphous silicon film absorbs the energy of the irradiated excimer laser beams.

In one embodiment of the method of using an excimer laser annealing apparatus to perform annealing of the present invention, the thermoregulating module provides a temperature regulating direction from the second portion to the first portion.

In one embodiment of the method of using an excimer laser annealing apparatus to perform annealing of the present invention, the light-absorbing components and the light-reflecting components are alternately arranged on the substrate holder.

The present invention further provides an excimer laser annealing apparatus having:

a substrate holder having
a support surface for supporting a substrate having an amorphous silicon film; and
a thermoregulating module being used to regulate the temperature on the support surface so as to control crystal orientation of amorphous silicon in the amorphous silicon film; and
an excimer laser unit being used to provide an excimer laser onto the substrate.

In one embodiment of the excimer laser annealing apparatus of the present invention, the thermoregulating module is constituted by a plurality of light-absorbing components and light-reflecting components mounted on the support surface.

In one embodiment of the excimer laser annealing apparatus of the present invention, the light-absorbing components and the light-reflecting components are embedded in the substrate holder.

Another object of the present invention is to provide a method of using an excimer laser annealing apparatus to perform annealing, wherein the excimer laser annealing apparatus includes a substrate holder and an excimer laser unit, wherein the substrate holder has a support surface for supporting a substrate having an amorphous silicon film and a thermoregulating module for regulating the temperature of the support surface so as to control crystal orientation of amorphous silicon in the amorphous silicon film; and the excimer laser unit is used to provide an excimer laser onto the substrate; wherein the method of using an excimer laser annealing apparatus to perform annealing comprises steps of:

providing the substrate having an amorphous silicon film on the substrate holder; and using the excimer laser unit to perform an annealing treatment on the amorphous silicon film so that the amorphous silicon of the amorphous silicon film recrystallizes along a thermoregulating direction of the thermoregulating module in a predetermined area to form a polysilicon film, wherein the predetermined area is an area of the amorphous silicon film which corresponds to the position of the thermoregulating module.

In one embodiment of the method of using an excimer laser annealing apparatus to perform annealing of the present invention, the thermoregulating module is constituted by a plurality of light-absorbing components and light-reflecting components mounted on the support surface.

In one embodiment of the method of using an excimer laser annealing apparatus to perform annealing of the present invention, during the process of performing the annealing treatment on the amorphous silicon film, the method further comprises a step of forming a temperature gradient between a first portion and a second portion of the amorphous silicon film, wherein the first portion is an area of the amorphous silicon film corresponding to the position of the light-reflecting components of the substrate holder; and the second portion is an area of the amorphous silicon film corresponding to the position of the light-absorbing components of the substrate holder.

In one embodiment of the method of using an excimer laser annealing apparatus to perform annealing of the present invention, in the step of forming the temperature gradient, the first portion of the amorphous silicon film absorbs the energy of the irradiated excimer laser beams and the energy of the excimer laser beams reflected by the light-reflecting components, and the second portion of the amorphous silicon film absorbs the energy of the irradiated excimer laser beams.

In one embodiment of the method of using an excimer laser annealing apparatus to perform annealing of the present invention, the thermoregulating module provides a temperature regulating direction from the second portion to the first portion.

In one embodiment of the method of using an excimer laser annealing apparatus to perform annealing of the present invention, the light-absorbing components and the light-reflecting components are embedded in the substrate holder.

In one embodiment of the method of using an excimer laser annealing apparatus to perform annealing of the present invention, there are at least two light-absorbing components and at least two light-reflecting components mounted on the substrate holder, and the light-absorbing components and the light-reflecting components are alternately arranged on the substrate holder.

The excimer laser annealing apparatus and the method thereof of the present invention mainly focuses on adding a thermoregulating module in the substrate holder to create an area with a temperature gradient between a higher temperature and a lower temperature so that amorphous silicon is controlled to recrystallize along a certain direction to become polysilicon with larger crystalline grain size, thereby improving the display effect of a liquid crystal display device.

DETAILED DESCRIPTION OF THE PREFERRED EMBODIMENTS

The foregoing objects, features and advantages adopted by the present invention can be best understood by referring to the following detailed description of the preferred embodiments and the accompanying drawings. Furthermore, the directional terms described in the present invention, such as upper, lower, front, rear, left, right, inner, outer, side and etc., are only directions referring to the accompanying drawings, so that the used directional terms are used to describe and understand the present invention, but the present invention is not limited thereto.

Figure 1:
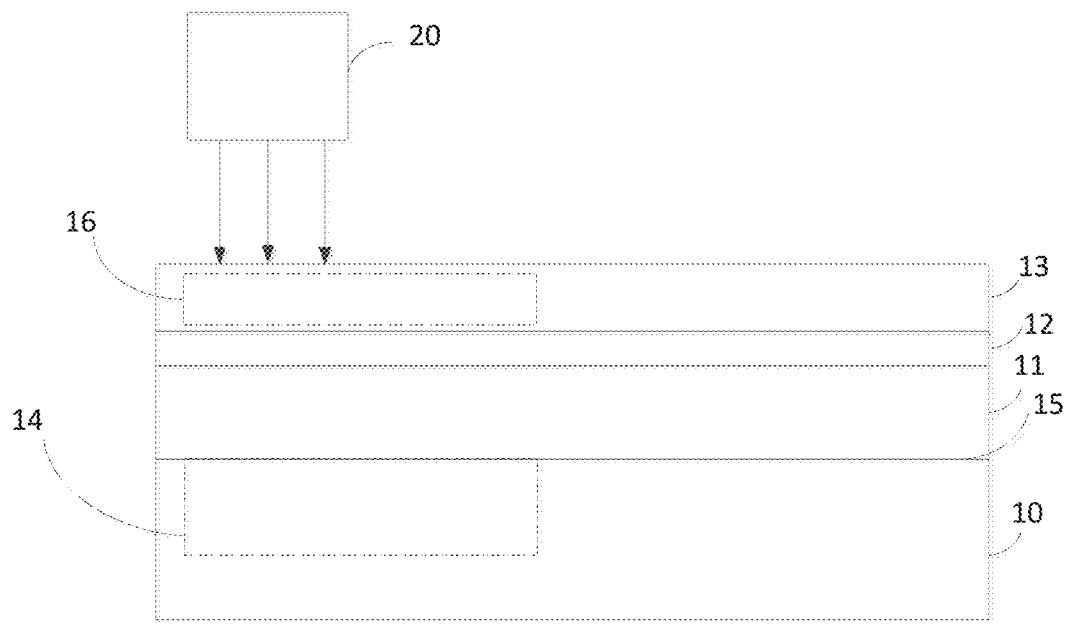
FIG. 1 is a schematic diagram of the structure of an excimer laser annealing apparatus according to a first embodiment of the present invention.

Please refer to FIG. 1, which is a schematic diagram of the structure of an excimer laser annealing apparatus according to a first embodiment of the present invention.

The excimer laser annealing apparatus of the present invention, as shown in FIG. 1, comprises a substrate holder 10 and an excimer laser unit 20. The substrate holder 10 has a support surface 15 and a thermoregulating module 14. The support surface 15 is used to support a substrate 11. The substrate 11 has an amorphous silicon film 13 formed thereon, and may further have a buffering layer 12 formed between the substrate 11 and the amorphous silicon film 13. The excimer laser unit 20 is used to provide excimer laser beams onto the substrate 11. The thermoregulating module 14 is used to regulate the temperature on the support surface 15 so as to control different areas of the amorphous silicon film to reach different temperatures, thereby controlling the crystal orientation of amorphous silicon in the amorphous silicon film 13.

The steps of the work process of the excimer laser annealing apparatus are as follows:

providing the substrate 11 having the amorphous silicon film 13 on the substrate holder 10; and using the excimer laser unit 20 to perform an annealing treatment on the amorphous silicon film 13 so that the amorphous silicon of the amorphous silicon film 13 recrystallizes along a thermoregulating direction of the thermoregulating module 14 in a predetermined area 16 to form a polysilicon film, wherein the predetermined area 16 is an area of the amorphous silicon film 13 which corresponds to the position of the thermoregulating module 14.

With the excimer laser beams generated by the excimer laser unit 20 irradiating the substrate 11, the amorphous silicon film 13 absorbs the energy of the excimer laser beams and then melts. The excimer laser beams are able to pass through the substrate 11 and irradiate the substrate holder 10.

The thermoregulating module 14 may be constituted by a plurality of light-absorbing components and light-reflecting components which are mounted on the support surface 15. The amorphous silicon film 13 in the predetermined area 16 includes a first portion and a second portion, wherein the first portion corresponds to the position of the light-reflecting components; and the second portion corresponds to the position of the light-absorbing components.

During the process of performing the annealing treatment on the amorphous silicon film 13, the amorphous silicon film 13 absorbs the energy of the excimer laser beams emitted directly from the excimer laser unit 20; the excimer laser beams of the excimer laser unit 20, in the meantime, pass through the substrate 11 and irradiate onto the support surface 15 where most of the excimer laser beams that are irradiated on the light-reflecting components mounted on the support surface 15 will be reflected back to the first portion by the light-reflecting components. The excimer laser beams that are irradiated on the light-absorbing components mounted on the support surface 15 will be absorbed by the light-absorbing components, and therefore will not be reflected back to the amorphous silicon film.

Since the first portion of the amorphous silicon film 13 absorbs the energy of the directly-irradiated excimer laser beams and the reflected excimer laser beams, and the second portion of the amorphous silicon film 13 only absorbs the energy of the directly-irradiated excimer laser beams, the energy or the temperature of the first portion is relatively greater than that of the second portion.

That is, a temperature gradient between a higher temperature and a lower temperature is formed in the predetermined area 16 of the amorphous silicon film 13 such that the amorphous silicon in the amorphous silicon film 13 recrystallizes along a direction from the second portion to the first portion.

The excimer laser annealing apparatus of the present invention mainly focuses on adding a thermoregulating module in the substrate holder to create an area with a temperature gradient between a higher temperature and a lower temperature so that amorphous silicon is controlled to recrystallize along a certain direction to become polysilicon with larger crystalline grain size, thereby improving the display effect of a liquid crystal display device.

Figure 2:
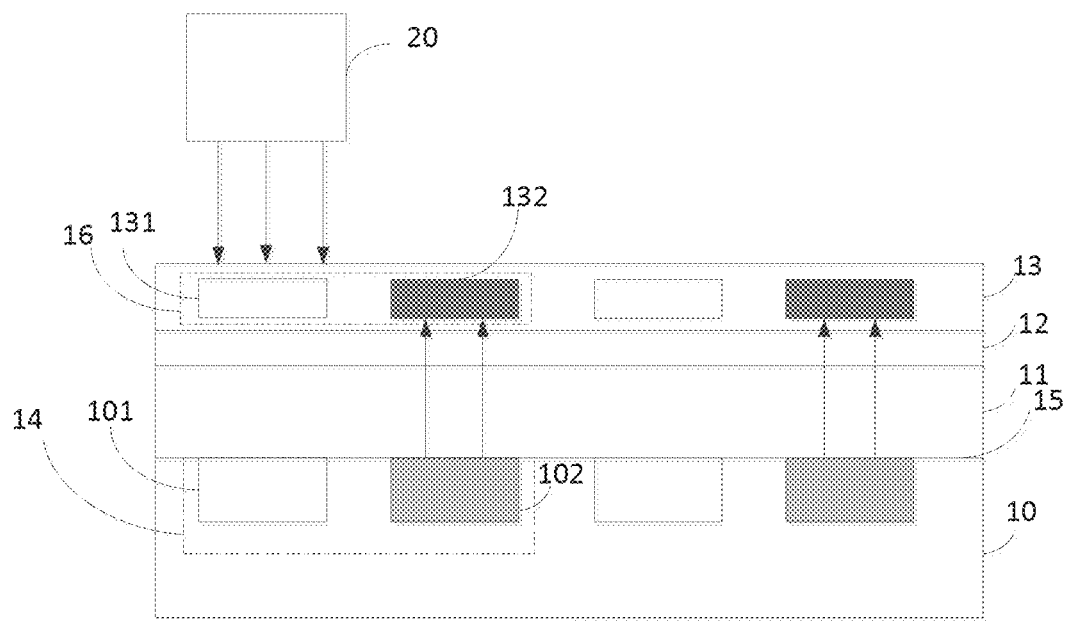
FIG. 2 is a schematic diagram of the structure of the excimer laser annealing apparatus according to a second embodiment of the present invention.

Please refer to FIG. 2, which is a schematic diagram of the structure of the excimer laser annealing apparatus according to a second embodiment of the present invention.

The excimer laser annealing apparatus of the present invention, as shown in FIG. 2, the excimer laser annealing apparatus includes a substrate holder 10 and an excimer laser unit 20. The substrate holder 10 has a support surface 15 and a thermoregulating module 14. The support surface 15 is used to support a substrate 11, wherein the substrate 11 has an amorphous silicon film 13 formed thereon. The substrate 11 may be a glass substrate. The substrate 11 may further have a buffering layer 12 formed between the substrate 11 and the amorphous silicon film 13. The buffering layer 12 is used to isolate impurities on the substrate 11 to keep the impurities from entering the amorphous silicon film 13. In one embodiment, the thickness of the buffering layer 12 may be 50 nm to 600 nm. Preferably, the thickness of the buffering layer 12 is 200 nm to 400 nm. The material of the buffering layer 12 may be silicon oxide. The excimer laser unit 20 provides excimer laser beams onto the substrate 11, wherein the excimer laser beams 20 may be irradiated on the substrate in a scanning manner.

Figure 3:
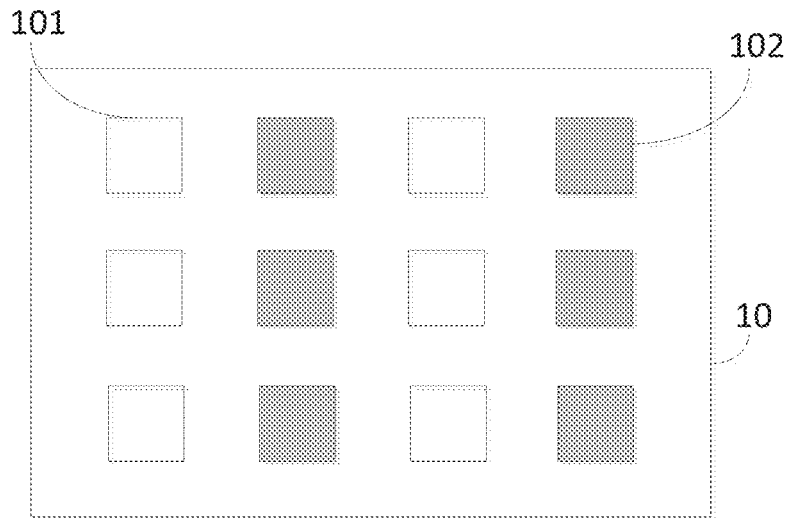
FIG. 3 is a schematic diagram showing the top view of a substrate holder in accordance with a preferred embodiment of the present invention.

Preferably, the thermoregulating module 14 is constituted by a plurality of light-absorbing components 101 and light-reflecting components 102 which are mounted on the support surface 15. In connection with FIG. 3, which is a schematic diagram showing the top view of a substrate holder in accordance with a preferred embodiment of the present invention, there are at least two light-absorbing components 101 and at least two light-reflecting components 102 mounted on the substrate holder 10. Preferably, the light-absorbing components 101 and the light-reflecting components 102 are alternately arranged on the substrate holder 10. Preferably, the light-absorbing components 101 and the light-reflecting components 102 are embedded in the substrate holder 10. For example, the substrate holder 10 may have a plurality of recesses formed on the support surface 15 thereof, and some of the recesses are coating with reflecting materials to form the light-reflecting components 102, and the other recesses are coated with light-absorbing materials to form the light-absorbing components 101, wherein the light-reflecting material may be mirror material.

The shape of the light-absorbing components 101 and the light-reflecting components 102 may be rectangular, triangular, circular, etc. The distance between the light-absorbing components and the light-reflecting components may be adjusted based on practical demands.

The excimer laser annealing apparatus of the present invention mainly focuses on adding a thermoregulating module in the substrate holder to create an area with a temperature gradient between a higher temperature and a lower temperature so that amorphous silicon is controlled to recrystallize along a certain direction to become polysilicon with larger crystalline grain size, thereby improving the display effect of a liquid crystal display device.

Figure 4:
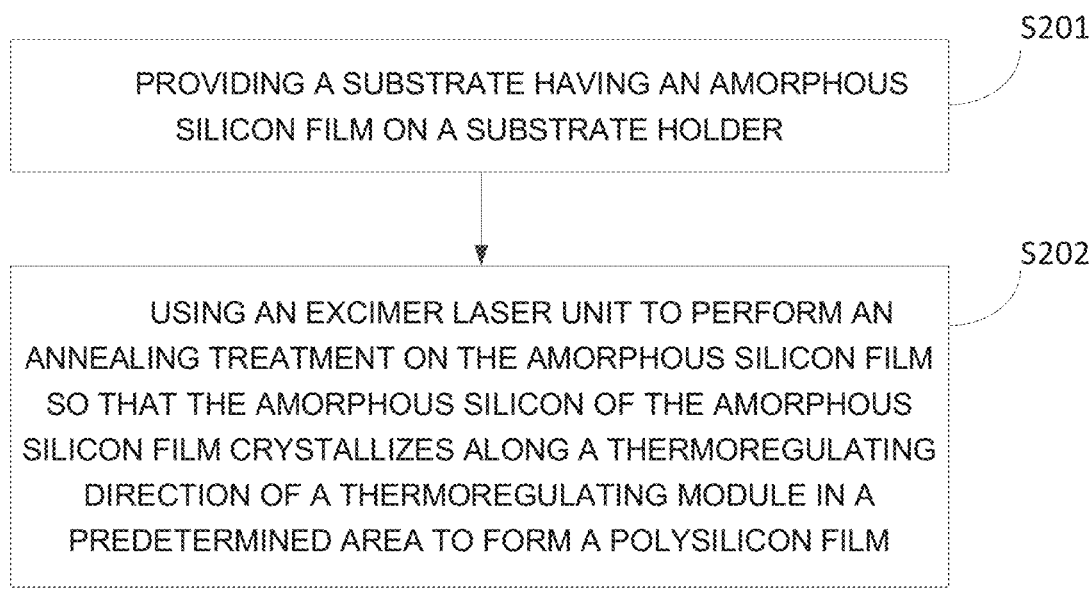
FIG. 4 is a flowchart of a method of using the excimer laser annealing apparatus in FIG. 2 to perform annealing according a preferred embodiment of the present invention.

FIG. 4 is a flowchart of a method of using the excimer laser annealing apparatus in FIG. 2 to perform annealing according a preferred embodiment of the present invention.

As shown in FIG. 4, the method of using the excimer laser annealing apparatus in FIG. 2 includes steps of:

S201: providing the substrate having an amorphous silicon film on the substrate holder; and S202: using the excimer laser unit to perform an annealing treatment on the amorphous silicon film so that the amorphous silicon of the amorphous silicon film recrystallizes along a thermoregulating direction of the thermoregulating module in a predetermined area to form a polysilicon film.

The predetermined area 16 is an area being on the amorphous silicon film 13 and corresponding to the position of the thermoregulating module 14.

The steps of performing an annealing treatment on the amorphous silicon film 13 are as follows:

In connection with FIG. 2, with the excimer laser beams generated by the excimer laser unit 20 irradiating the substrate 11, the amorphous silicon film 13 absorbs the energy of the excimer laser beams and then melts. The excimer laser beams are able to pass through the substrate 11 and irradiate the substrate holder 10.

The thermoregulating module 14 is constituted by a plurality of light-absorbing components 101 and light-reflecting components 102 which are mounted on the support surface 15. The amorphous silicon film 13 in the predetermined area 16 includes a first portion 132 and a second portion 131, wherein the first portion 132 corresponds to the position of the light-reflecting components 102; and the second portion 131 corresponds to the position of the light-absorbing components 101.

During the process of performing the annealing treatment on the amorphous silicon film 13, the amorphous silicon film 13 absorbs the energy of the excimer laser beams emitted directly from the excimer laser unit 20; the excimer laser beams of the excimer laser unit 20, in the meantime, pass through the substrate 11 and irradiate onto the support surface 15 where most of the excimer laser beams that are irradiated on the light-reflecting components 102 mounted on the support surface 15 will be reflected back to the first portion 132 by the light-reflecting components 102. The excimer laser beams that are irradiated on the light-absorbing components mounted on the support surface 15 will be absorbed by the light-absorbing components 101, and therefore will not be reflected back to the amorphous silicon film 13.

Since the first portion 132 of the amorphous silicon film 13 absorbs the energy of the directly-irradiated excimer laser beams and the energy of the reflected excimer laser beams reflected by the light-reflecting components 102, and the second portion 131 of the amorphous silicon film 13 only absorbs the energy of the directly-irradiated excimer laser beams, the energy or the temperature of the first portion 132 is relatively greater than that of the second portion 131.

That is, a temperature gradient between a higher temperature and a lower temperature is formed in the predetermined area 16 of the amorphous silicon film 13 such that the amorphous silicon in the amorphous silicon film 13 recrystallizes along a direction from the second portion to the first portion.

The method of using an excimer laser annealing apparatus to perform annealing of the present invention mainly focuses on adding a thermoregulating module in the substrate holder to create an area with a temperature gradient between a higher temperature and a lower temperature so that amorphous silicon is controlled to recrystallize along a certain direction to become polysilicon with larger crystalline grain size, thereby improving the display effect of a liquid crystal display device.

The present invention has been described with preferred embodiments thereof, and it is understood that many changes and modifications to the described embodiment can be carried out without departing from the scope and the spirit of the invention that is intended to be limited only by the appended claims.

What is claimed is:

1. A method of using an excimer laser annealing apparatus to perform annealing, wherein the excimer laser annealing apparatus includes a substrate holder and an excimer laser unit, wherein the substrate holder has a support surface for supporting a substrate having an amorphous silicon film and a thermoregulating module for regulating the temperature on the support surface so as to control crystal orientation of amorphous silicon in the amorphous silicon film, wherein the thermoregulating module is constituted by at least two light-absorbing components and at least two light-reflecting components mounted on the support surface, wherein the light-absorbing components and the light-reflecting components are embedded in the substrate holder; and the excimer laser unit is used to irradiate excimer laser beams onto the substrate; wherein the method of using an excimer laser annealing apparatus to perform annealing comprises steps of:

providing the substrate having an amorphous silicon film on the substrate holder; and using the excimer laser unit to perform an annealing treatment on the amorphous silicon film so that the amorphous silicon of the amorphous silicon film recrystallizes along a thermoregulating direction of the thermoregulating module in a predetermined area to form a polysilicon film, wherein the predetermined area is an area of the amorphous silicon film which corresponds to the position of the thermoregulating module.

2. The method of using an excimer laser annealing apparatus to perform annealing as claimed in claim 1, wherein during the process of performing the annealing treatment on the amorphous silicon film, the method further comprises a step of forming a temperature gradient between a first portion and a second portion of the amorphous silicon film, wherein the first portion is an area of the amorphous silicon film corresponding to the position of the light-reflecting components of the substrate holder; and the second portion is an area of the amorphous silicon film corresponding to the position of the light-absorbing components of the substrate holder.

3. The method of using an excimer laser annealing apparatus to perform annealing as claimed in claim 2, wherein in the step of forming the temperature gradient, the first portion of the amorphous silicon film absorbs the energy of the irradiated excimer laser beams and the energy of the excimer laser beams reflected by the light-reflecting components, and the second portion of the amorphous silicon film absorbs the energy of the irradiated excimer laser beams.

4. The method of using an excimer laser annealing apparatus to perform annealing as claimed in claim 2, wherein the thermoregulating module provides a temperature regulating direction from the second portion to the first portion.

5. The method of using an excimer laser annealing apparatus to perform annealing as claimed in claim 1, wherein the light-absorbing components and the light-reflecting components are alternately arranged on the substrate holder.

6. An excimer laser annealing apparatus comprising:
a substrate holder having
a support surface for supporting a substrate having an amorphous silicon film; and
a thermoregulating module being used to regulate the temperature on the support surface so as to control crystal orientation of amorphous silicon in the amorphous silicon film;
wherein the thermoregulating module is constituted by a plurality of light-absorbing components and light-reflecting components mounted on the support surface; and
an excimer laser unit being used to provide an excimer laser onto the substrate.

7. The excimer laser annealing apparatus as claimed in claim 6, wherein the light-absorbing components and the light-reflecting components are embedded in the substrate holder.

8. A method of using an excimer laser annealing apparatus to perform annealing, wherein the excimer laser annealing apparatus includes a substrate holder and an excimer laser unit, wherein the substrate holder has a support surface for supporting a substrate having an amorphous silicon film and a thermoregulating module for regulating the temperature of the support surface so as to control crystal orientation of amorphous silicon in the amorphous silicon film; and the excimer laser unit is used to provide an excimer laser onto the substrate; wherein the method of using an excimer laser annealing apparatus to perform annealing comprises steps of:

providing the substrate having an amorphous silicon film on the substrate holder; and using the excimer laser unit to perform an annealing treatment on the amorphous silicon film so that the amorphous silicon of the amorphous silicon film recrystallizes along a thermoregulating direction of the thermoregulating module in a predetermined area to form a polysilicon film, wherein the predetermined area is an area of the amorphous silicon film which corresponds to the position of the thermoregulating module.

9. The method of using an excimer laser annealing apparatus to perform annealing as claimed in claim 8, wherein the thermoregulating module is constituted by a plurality of light-absorbing components and light-reflecting components mounted on the support surface.

10. The method of using an excimer laser annealing apparatus to perform annealing as claimed in claim 9, wherein during the process of performing the annealing treatment on the amorphous silicon film, the method further comprises a step of forming a temperature gradient between a first portion and a second portion of the amorphous silicon film, wherein the first portion is an area of the amorphous silicon film corresponding to the position of the light-reflecting components of the substrate holder; and the second portion is an area of the amorphous silicon film corresponding to the position of the light-absorbing components of the substrate holder.

11. The method of using an excimer laser annealing apparatus to perform annealing as claimed in claim 10, wherein in the step of forming the temperature gradient, the first portion of the amorphous silicon film absorbs the energy of the irradiated excimer laser beams and the energy of the excimer laser beams reflected by the light-reflecting components, and the second portion of the amorphous silicon film absorbs the energy of the irradiated excimer laser beams.

12. The method of using an excimer laser annealing apparatus to perform annealing as claimed in claim 10, wherein the thermoregulating module provides a temperature regulating direction from the second portion to the first portion.

13. The method of using an excimer laser annealing apparatus to perform annealing as claimed in claim 9, wherein the light-absorbing components and the light-reflecting components are embedded in the substrate holder.

14. The method of using an excimer laser annealing apparatus to perform annealing as claimed in claim 9, wherein there are at least two light-absorbing components and at least two light-reflecting components mounted on the substrate holder, and the light-absorbing components and the light-reflecting components are alternately arranged on the substrate holder.

\* \* \* \* \*